United States Patent [19]
Ranjan et al.

[11] Patent Number: 5,736,013
[45] Date of Patent: Apr. 7, 1998

[54] METHOD FOR FORMING AN IMPROVED MAGNETIC MEDIA INCLUDING SPUTTERING OF SELECTED OXIDES OR NITRIDES IN THE MAGNETIC LAYER, AND APPARATUS FOR SAME

[75] Inventors: Rajiv Yadav Ranjan, San Jose; Miaogen Lu, Fremont; Tsutomu Tom Yamashita, Milpitas; Tu Chen, Monte Sereno, all of Calif.

[73] Assignee: Komag, Inc., San Jose, Calif.

[21] Appl. No.: 775,987

[22] Filed: Jan. 3, 1997

Related U.S. Application Data

[63] Continuation of Ser. No. 223,636, Apr. 6, 1994, abandoned.
[51] Int. Cl.$^6$ .................................................. C23C 14/34
[52] U.S. Cl. .............................. 204/192.2; 204/192.15; 204/298.13
[58] Field of Search ...................... 204/192.15, 192.12, 204/192.2, 298.12, 298.13

[56] References Cited

U.S. PATENT DOCUMENTS

| | | | |
|---|---|---|---|
| 4,415,427 | 11/1983 | Hidler et al. | 204/298.26 |
| 4,488,956 | 12/1984 | Scherer et al. | 204/298.12 X |
| 4,550,062 | 10/1985 | Takayama et al. | 428/611 |
| 4,711,810 | 12/1987 | Ando et al. | 428/336 |
| 4,749,459 | 6/1988 | Yamashita et al. | 204/192.15 |
| 4,786,564 | 11/1988 | Chen et al. | 428/694 |
| 4,952,295 | 8/1990 | Kawabata et al. | 204/298.26 X |
| 4,988,578 | 1/1991 | Yamashita et al. | 428/678 |
| 5,062,938 | 11/1991 | Howard | 204/192.2 |
| 5,066,552 | 11/1991 | Howard et al. | 428/694 |
| 5,244,555 | 9/1993 | Allen et al. | 204/192.2 |
| 5,326,637 | 7/1994 | Nasu et al. | 204/192.2 X |
| 5,434,014 | 7/1995 | Kanamaru et al. | 204/192.2 X |

FOREIGN PATENT DOCUMENTS

| | | | |
|---|---|---|---|
| 0531035 | 3/1993 | European Pat. Off. | G11B 5/64 |
| 573880 | 3/1993 | Japan | G11B 5/66 |
| 5197944 | 8/1993 | Japan | G11B 5/66 |

OTHER PUBLICATIONS

Williams and Comstock, "An Analytical Model of the Write Process in Digital Magnetic Recording", 17th Annual AIP Conf. Proc., Part I, No. 5, 1971, pp. 738–742.

Zhu et. al., "Micromagnetic Studies of Thin Metallic Films", Journal of Applied Physics, vol. 63, No. 8, 1988, p. 3248.

Chen et. al., "Physical Origin of Limits in the Performance of Thin–Film Longitudinal Recording Media", IEEE Trans. Mag., vol. 24, No. 5, 1988, p. 2700.

Murdock et. al., "Roadmap to 10 Gb/in$^2$ Media: Challenges", IEEE Trans. Mag., 1992, p. 3078.

Opfer et. al., "Thin Film Memory Disk Development", Hewlett Packard Journal, Nov., 1985, pp. 4–10.

Aboaf et. al., "Magnetic Properties and Structure of Co–Pt Thin Film", IEEE Trans. Mag., MAG–19, No. 4, 1983, p. 1514.

Shimizu et al., "CoPtCr Composite Magnetic Thin Films", IEEE Trans. Mag., vol. 28, No. 5, 1992, pp. 3102–3104.

Murayama et al., "Effects of Oxide Addition on Magnetic and Structural Properties of CoNiPt Alloy Films", J. Appl. Physics, vol. 75, No. 10, May 1994, pp. 6147–6149.

*Primary Examiner*—Nam Nguyen
*Attorney, Agent, or Firm*—Jonathan A. Small

[57] ABSTRACT

A Co—Pt based magnetic alloy which has been sputtered with an oxide or nitride of a primary constituent of the magnetic layer, e.g., CoO below about 10 at. %, provides improved coercivity, squareness, and reduced noise as compared to magnetic alloys with oxygen introduced by other methods. The alloy is vacuum deposited, for example, by sputtering, and the oxide or nitride may be introduced from the sputtering target from which the magnetic layer materials come or from a separate sputtering target. Examples of such oxides and nitrides include CoO, $Co_2O_3$, $Co_3O_4$, $CrO_2$, $Cr_2O_3$, $TiO_2$, $Ta_2O_5$, $Al_2O_3$, WO, CoN, $Co_2N$, TiN, TaN, CrN, NiN, etc.

10 Claims, 8 Drawing Sheets

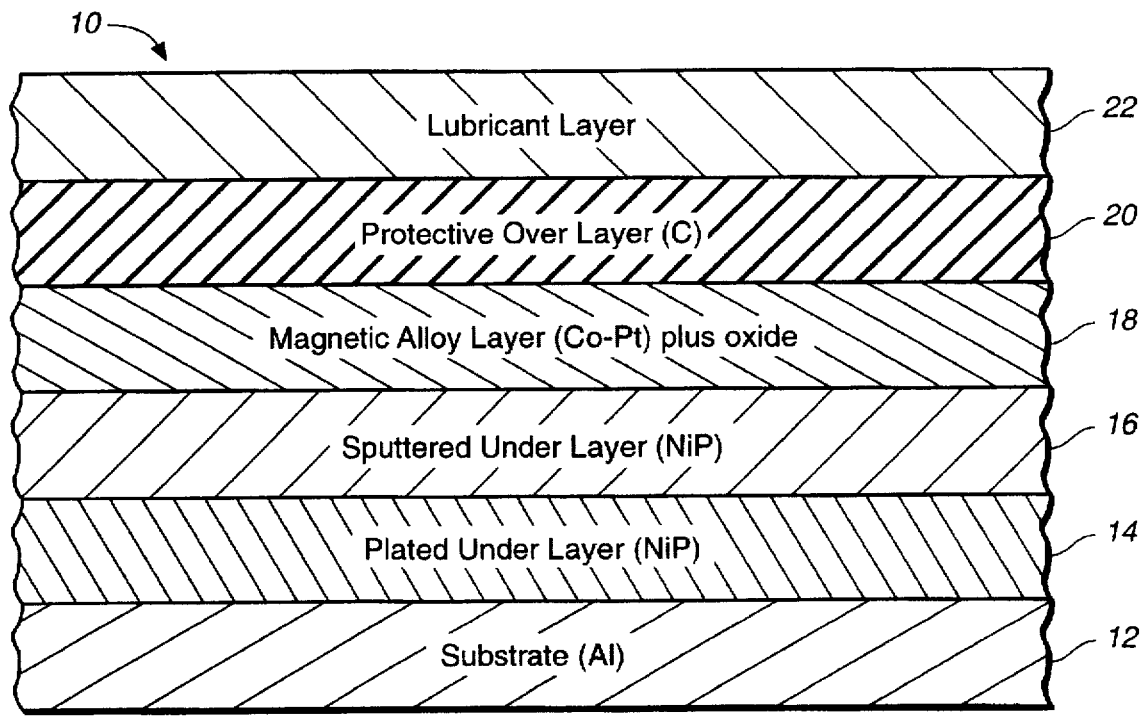
FIG._1
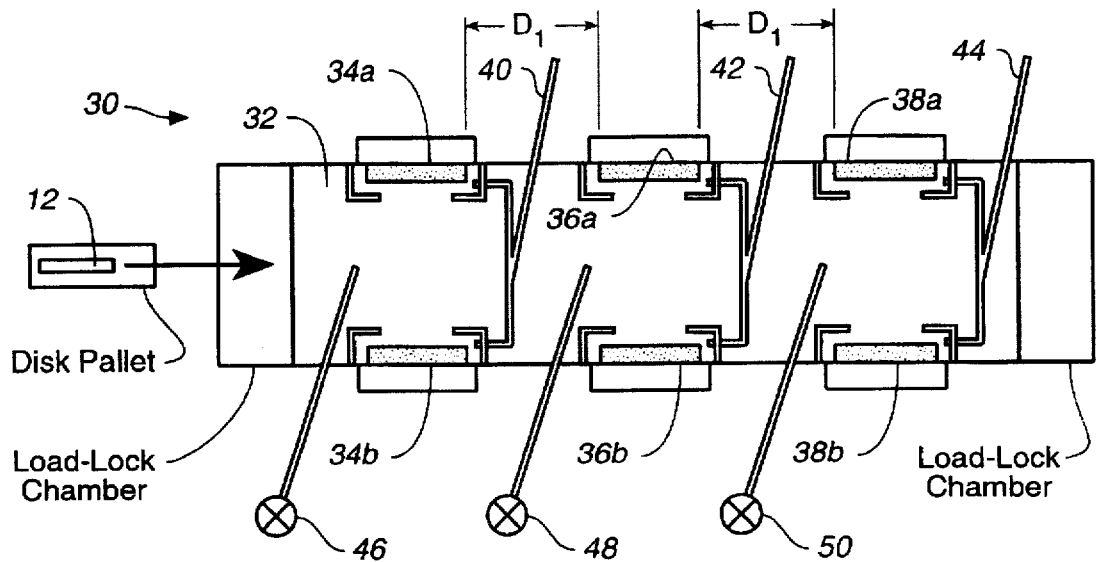
FIG._2

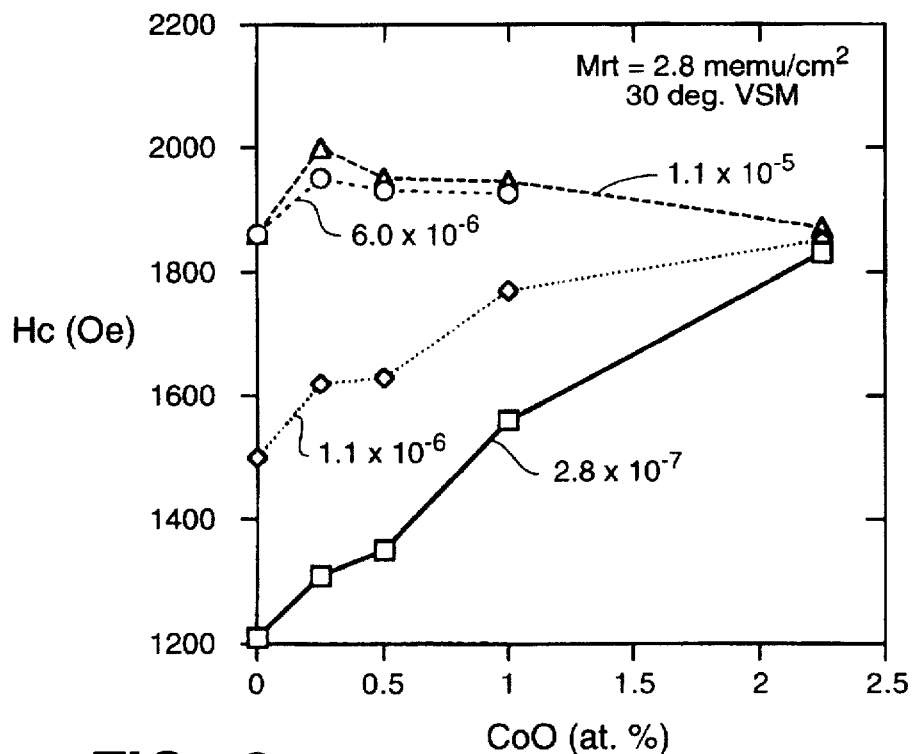
FIG._3
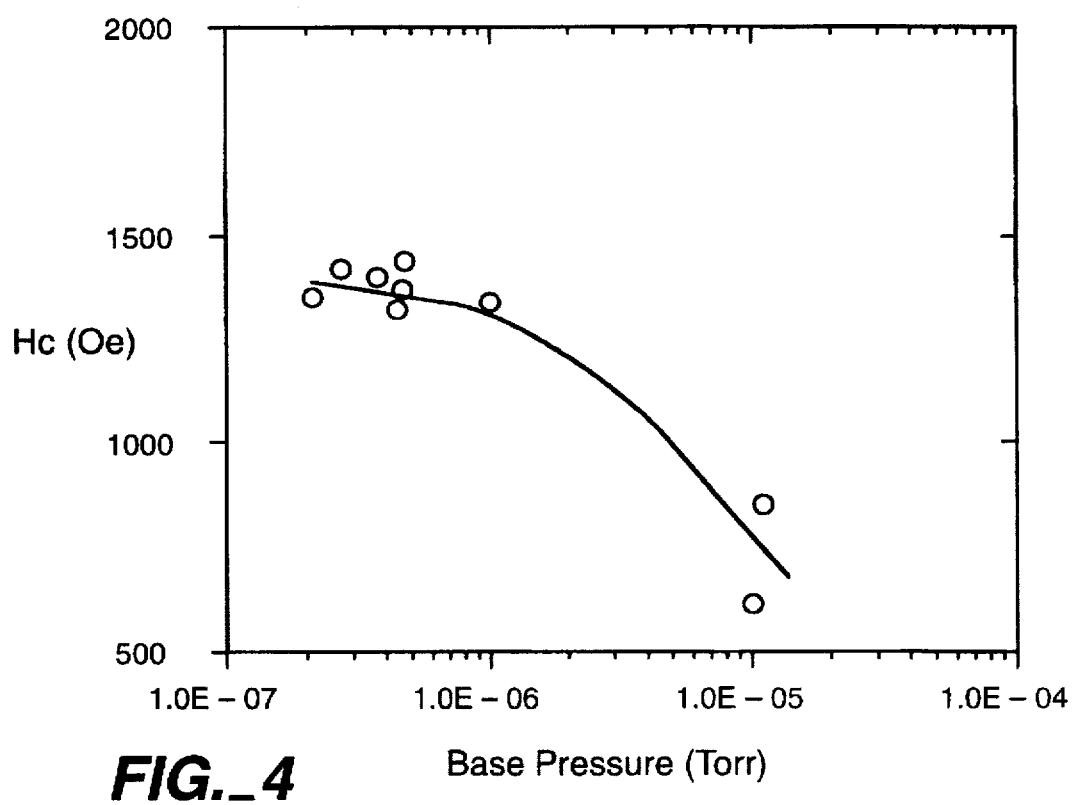
FIG._4

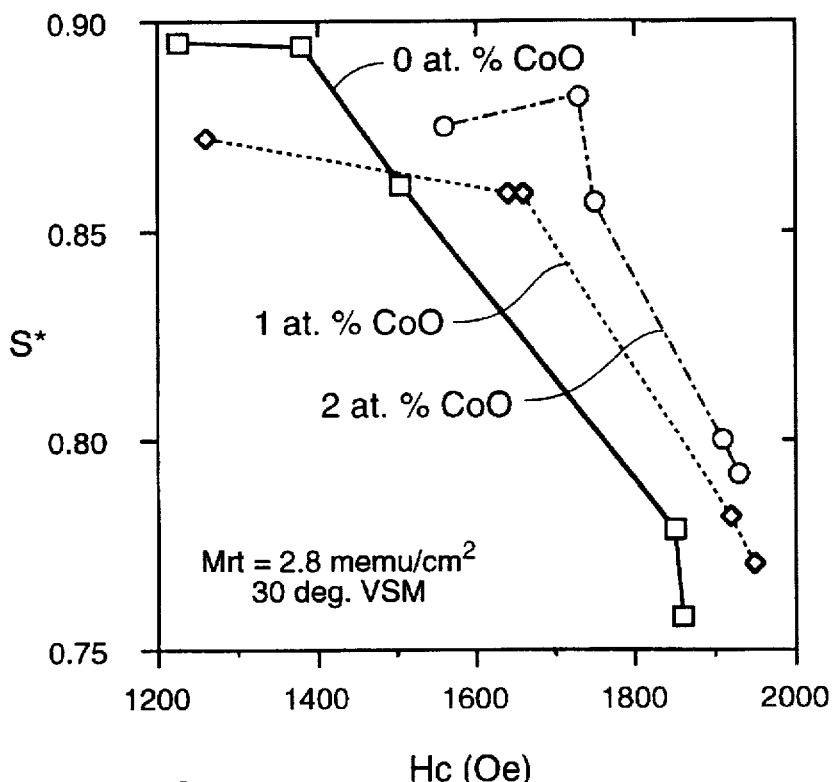
FIG._5
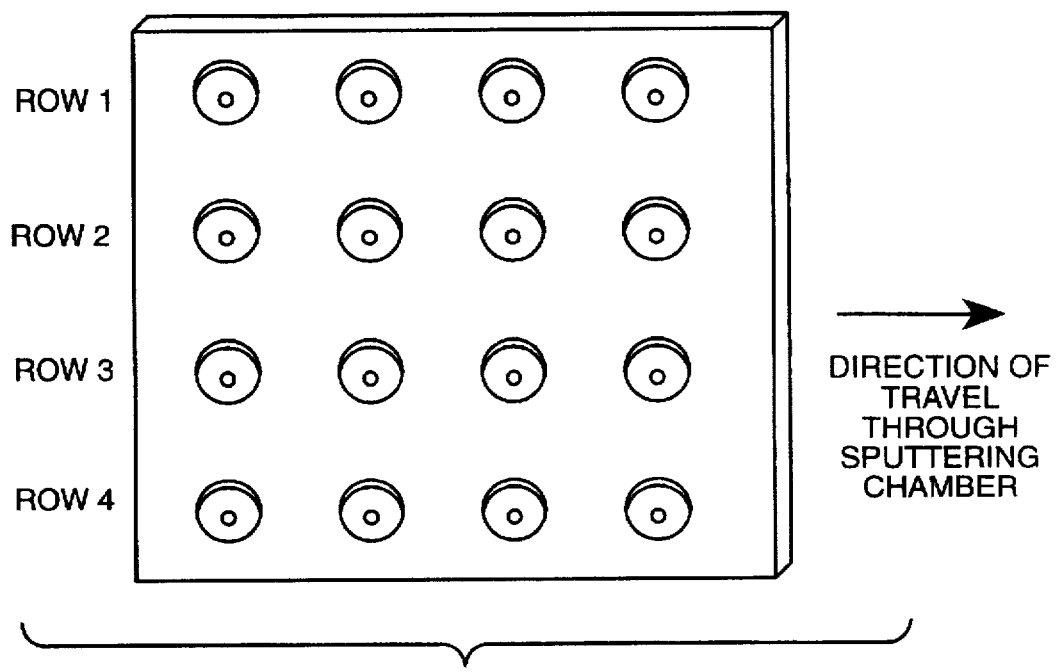
FIG._6

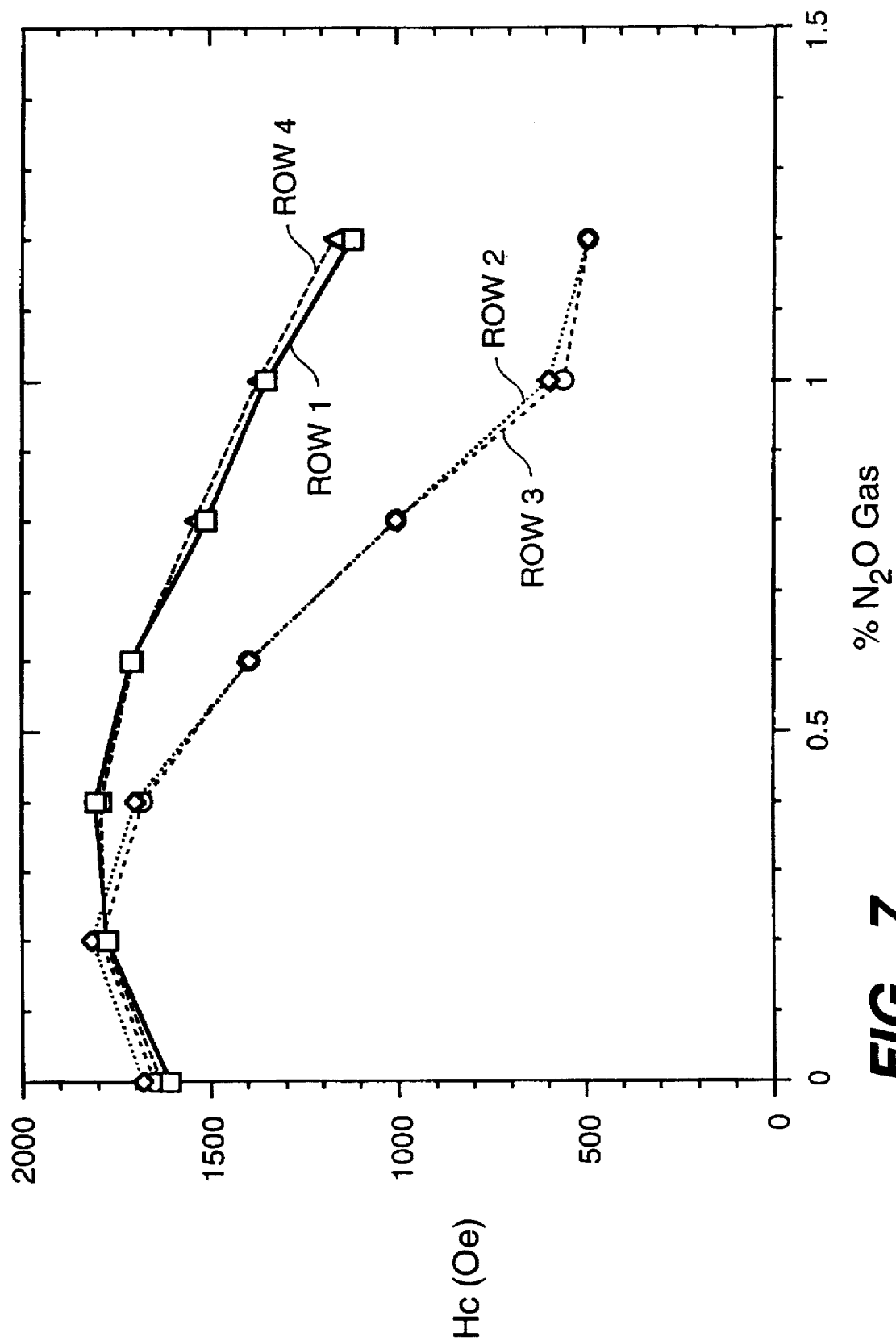
*FIG._7*

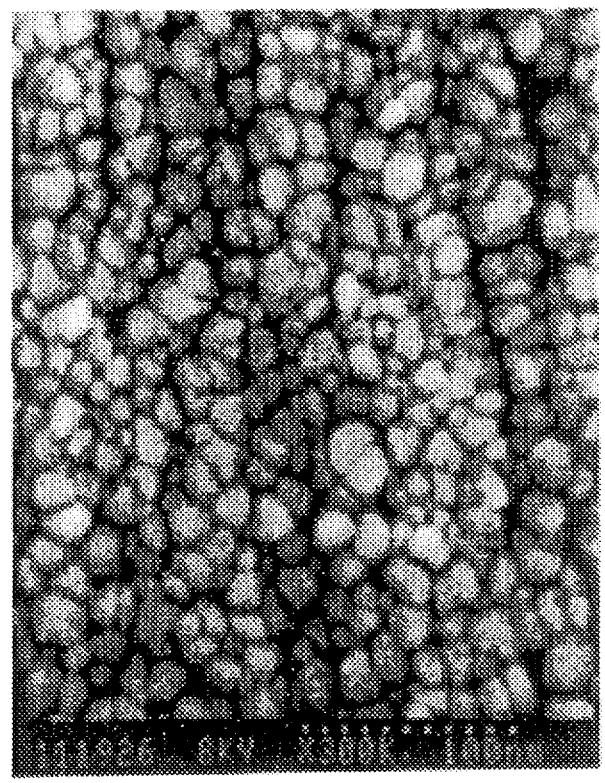
FIG._8A
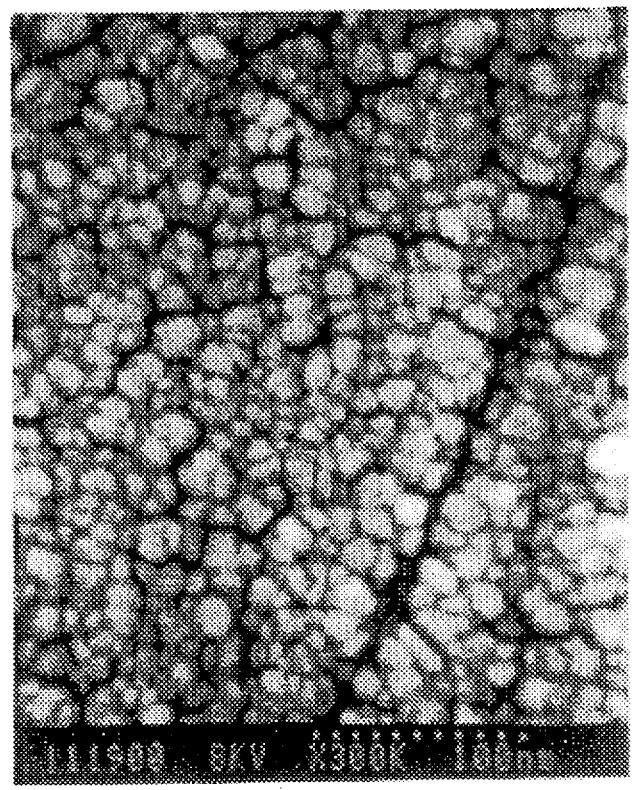
FIG._8B

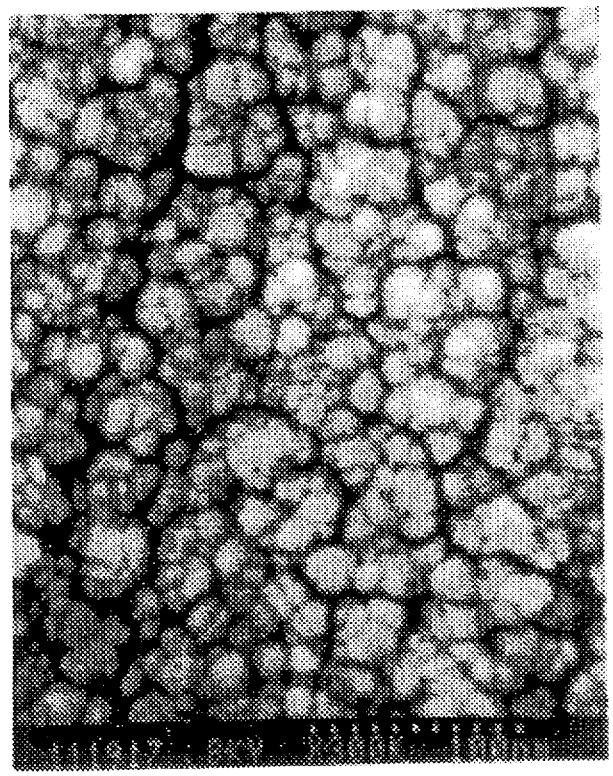
FIG._8C
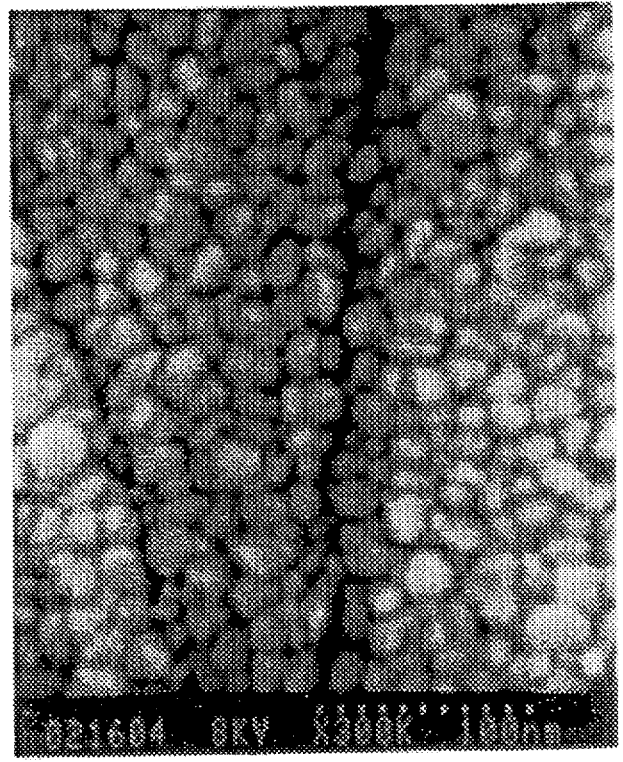
FIG._9A

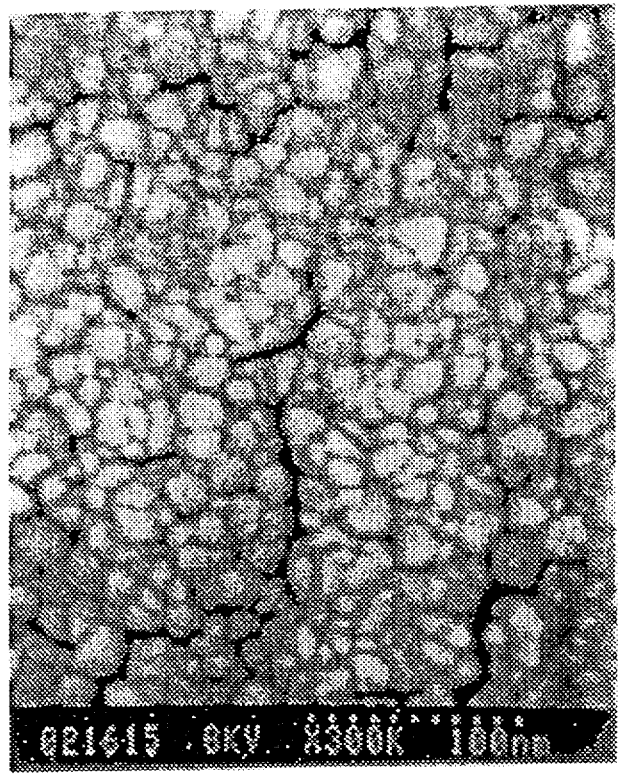
FIG._9B
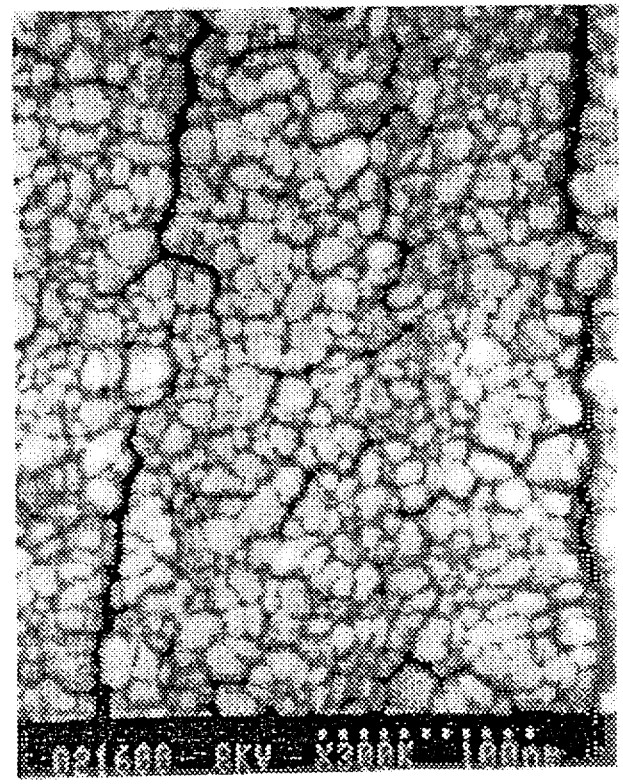
FIG._9C

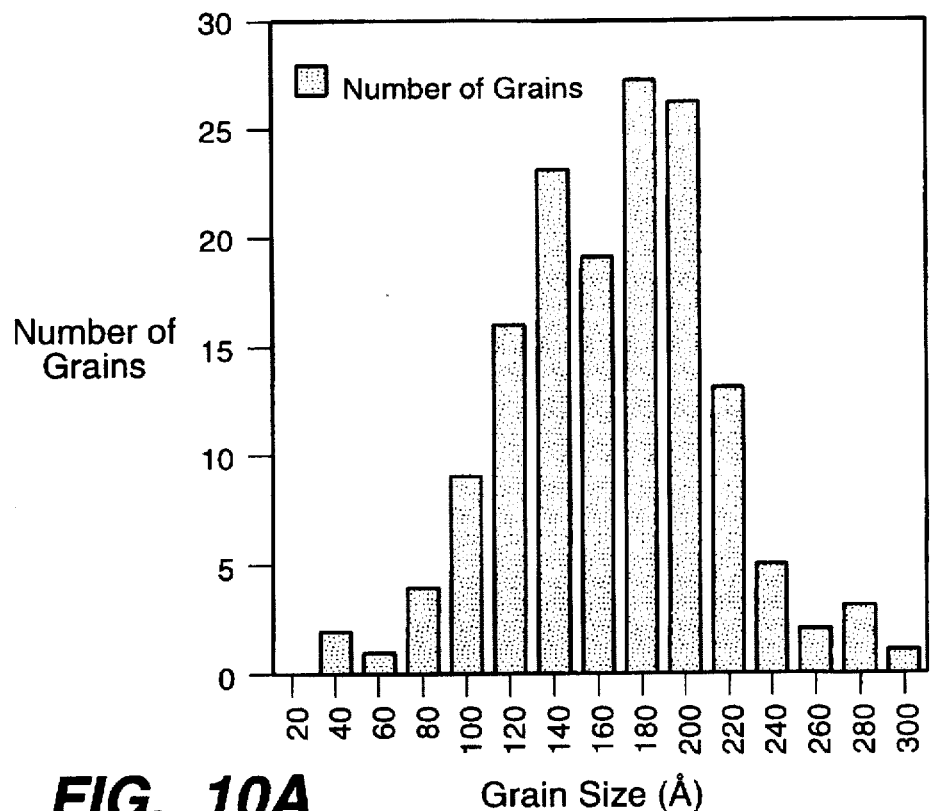
FIG._10A
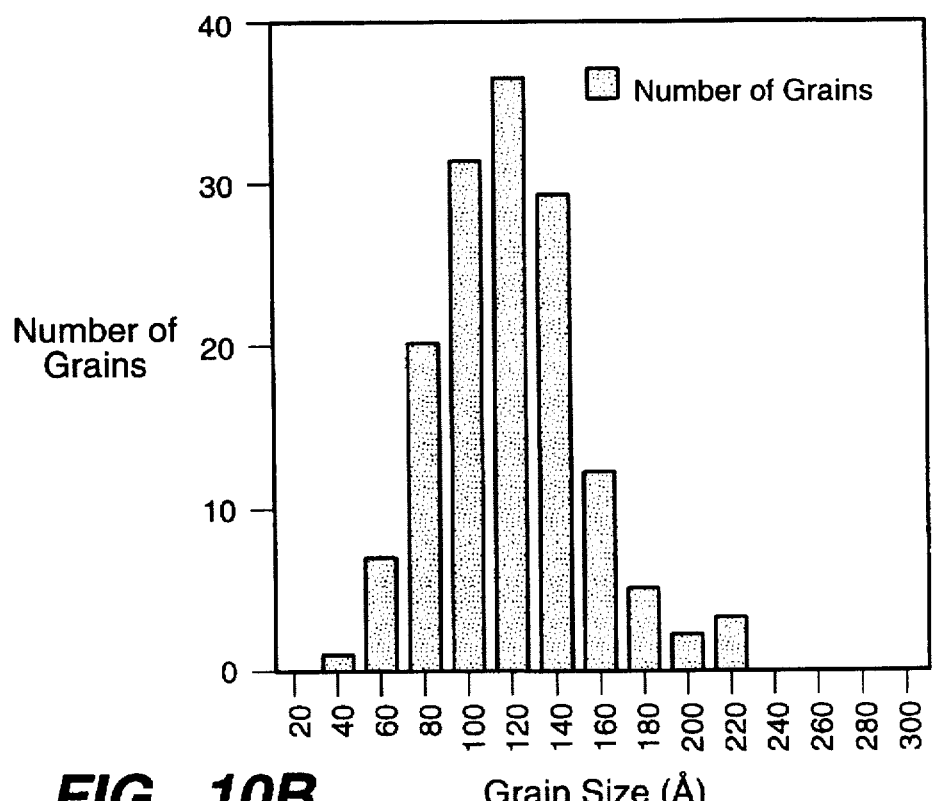
FIG._10B

METHOD FOR FORMING AN IMPROVED MAGNETIC MEDIA INCLUDING SPUTTERING OF SELECTED OXIDES OR NITRIDES IN THE MAGNETIC LAYER, AND APPARATUS FOR SAME

The present application is a continuation of application Ser. No. 08/223,636, filed Apr. 6, 1994, now abandoned.

FIELD OF THE INVENTION

The present invention relates principally to the manufacture of magnetic recording media used in rigid disc drives commonly used for computer data storage. In particular, the method of the present invention uses a target containing an oxide or a nitride of at least one of the magnetic media's principal constituents in the sputtering process to provide a low noise media exhibiting high coercivity and improved squareness.

BACKGROUND

Recording performance for magnetic disks is commonly determined by three basic characteristics—PW50, overwrite, and noise. PW50 is the pulse width of the bits expressed in either time or distance, defined as the width of the pulse at half-maximum. A narrower (and more well-defined) pulse allows for higher recording density. A wide PW50 means that the bits are crowded together, resulting in each adjoining bits interfering with one another. This interference is termed inter-symbol interference. Excessive inter-symbol interference limits the packing density of bits in a given area, and hence limits the recording capacity of the magnetic media.

Means of reducing PW50 include reducing the magnetic remnant-layer thickness product ("Mrt") or reducing the thickness ("t") for a given alloy of the magnetic layer of the media (the media being comprised of a substrate, and one or more layers, including a magnetic layer, formed on the substrate). Another means of reducing PW50 is to increase hysteresis loop squareness ("S", including coercivity squareness, "S*", and remnant coercivity squareness, "S*rem"), and narrow the switching field distribution, as described by William and Comstock in "An Analytical Model of the Write Process in Digital Magnetic Recording," A.I.P. Conf. Proc. Mag. Materials, 5, p. 738 (1971). Yet another means for reducing the PW50 is to increase the coercivity ("Hc") of the media.

Overwrite ("OW") is a measure of the ability of the media to accommodate overwriting existing data. That is, OW is a measure of what remains of a first signal after a second signal (for example of a different frequency) has been written over it on the media. OW is poor when a significant amount of the first signal remains. OW is generally affected by the coercivity, the thickness, and the hysteresis loop squareness of the magnetic layer. For example, a high Hc can result in a recording head having difficulty saturating (i.e., writing data to) the magnetic layer, resulting in poor overwrite.

Noise performance of a magnetic layer can be defined in terms of read jitter and write jitter. Read jitter is primarily determined by the amount of signal available from a bit, and the electronic noise in the channel. A higher Mrt or thicker magnetic layer for a given alloy will typically provide reduced read jitter. Unlike read jitter, write jitter is determined by the intrinsic noise of the magnetic layer. Intrinsic media noise has been theoretically modeled by Zhu et al. in "Micromagnetic Studies of Thin Metallic Films", J. Appl. Phys., vol. 63, no. 8, p. 3248 (1988), which is incorporated by reference herein. Chen et al. describe the source of intrinsic media noise in "Physical Origin of Limits in the Performance of Thin-Film Longitudinal Recording Media," IEEE Trans. Mag., vol. 24, no. 6, p. 2700 (1988), which is also incorporated by reference herein. The primary source of intrinsic noise in thin film media is from interparticle exchange interaction. In general, the higher the exchange interaction, the greater the noise.

The noise from interparticle exchange interaction can be reduced by isolating the individual particles. This may be accomplished by spacing the grains apart from one another, or by interposing a non-magnetic material or insulator at the grain boundaries as described by Chen et al. in the aforementioned "Physical Origin of Limits in the Performance of Thin-Film Longitudinal Recording Media." The amount of separation need be only a few angstroms for there to be a significant reduction in interparticle exchange interaction. A reduction in interparticle exchange interaction has also been tied to an increase in Hc by Chen et al. and by Zhu et al. in the aforementioned references.

There is another interparticle interaction, called magnetostatic interaction, which acts over a much greater distance between particles as compared to the exchange interaction. Reducing the magnetostatic interaction does reduce intrinsic media noise slightly. However, the effects of magnetostatic interaction actually improve hysteresis loop squareness and narrow the switching field distribution, and hence improve PW50 and OW. Therefore, magnetostatic interaction is generally tolerated.

In peak-detection type recording channels, noise, together with inter-symbol interference, contributes to the uncertainty in the location of the individual bits, which cause the data to be read with some displacement in timing from that which is expected. This displacement is referred to as bit shift. Bit shift must be minimized for a given timing window of a bit in order to assure accuracy in reading that bit.

In order to obtain the best performance from the magnetic media, each of the above criteria—PW50, overwrite, and noise—must be optimized. This is a formidable task, as each of these performance criteria are inter-related. For example, obtaining a narrower PW50 by increasing the Hc will adversely affect overwrite, since increasing Hc degrades overwrite. A thinner media having a lower Mrt yields a narrower PW50, however the read jitter increases because the media signal is reduced. Increasing the squareness of the hysteresis loop contributes to narrower PW50, but generally increasing squareness increases noise. Thus, the amount that PW50 may be narrowed is limited by the increase in noise.

Providing a mechanism for separating or isolating the grains to break the exchange coupling can effectively reduce the intrinsic media noise and increase coercivity. Noise is improved by eliminating the interparticle exchange interaction. A slight further reduction of noise is possible by reducing magnetostatic interaction, but this reduces the hysteresis loop squareness and increases the switching field distribution, which degrades PW50 and overwrite.

In order to obtain the optimum media performance, the Mrt must be reduced for better overwrite and PW50, but still retain sufficient signal to maintain acceptable read jitter. This is principally accomplished by reducing the magnetic layer thickness (thereby reducing the space loss between the recording head pole tip and the magnetic layer), and using an alloy having a higher saturation magnetization ("Ms").

Therefore, an optimal thin film magnetic recording media for high density recording applications, i.e., that can support high bit densities, provides low noise without sacrificing the switching field distribution and squareness. Recording density can then be increased since bit jitter is reduced. In order to achieve optimal performance, the individual grains of the magnetic layer of the media must be isolated to eliminate the exchange interaction, and grains must be uniform and have a tight distribution of sizes to minimize intrinsic media noise while maintaining high coercivity and squareness.

One type of magnetic media which has allowed optimizing certain of the above performance criteria is based on alloys of cobalt (Co) and platinum (Pt). CoPt is typically alloyed with nickel (Ni), chromium (Cr), etc. Attributes of CoPt alloys have been described by Murdock et al. in "Roadmap to 10 Gb/in$^2$ Media: Challenges", IEEE Trans. Mag., 1992, page 3078, by Opfer et al. in "Thin Film Memory Disk Development", Hewlett-Packard Journal (November 1985), and by Aboaf et al., in "Magnetic Properties and Structure of Co-Pt Thin Film", IEEE Trans. Mag., page 1514 (1983), each incorporated herein by reference. Increasing storage capacity demands and performance requirements have motivated a search for ways to improve Co-Pt based alloys.

In order to control coercivity, it is known to sputter deposit the magnetic layer in the presence of gaseous oxygen or nitrogen, for example as taught by Yamashita et al. in U.S. Pat. No. 4,988,578, which is incorporated herein by reference. Also, in order to decrease the media noise, it is known to introduce oxygen into the magnetic layer in a concentration of 5 to 30 at. %, as taught by Howard et al. in U.S. Pat. No. 5,066,552, incorporated by reference herein. As with the teachings of Yamashita et al., Howard et al. teaches the formation of the magnetic layer of the disk by vacuum sputtering in an argon ambient into which oxygen has been introduced. According to these references, either oxygen or nitrogen is introduced into the magnetic layer from the ambient.

Shimizu et al. in "CoPtCr Composite Magnetic Thin Films", IEEE Trans. Mag., vol. 28, No. 5, page 3102 (1992), which is incorporated herein by reference, disclose co-sputtering an oxide of an impurity and the CoPtCr magnetic alloy. Specifically, the media noise, in-plane coercivity, and S* were noted to improve with an introduction of approximately 10% by volume ("vol. %") $SiO_2$. This result is presumably obtained because the immiscibility of the oxide causes it to segregate at the magnetic grain boundaries, thereby reducing the intergranular exchange interaction (coupling) between the magnetic grains.

A variation on the approach of Shimizu et al. is disclosed by Howard in U.S. Pat. No. 5,062,938, which is incorporated herein by reference, in which an impurity such as yttrium (Y), silicon (Si), hafnium (Hf), germanium (Ge), tin (Sn) or zirconium (Zr) is co-sputtered with the cobalt-based magnetic alloy material. Thereafter, the sputtered layer containing the impurity is oxidized when annealed separately in the presence of oxygen. It is believed that the impurity elements will segregate at the grain boundaries, and when oxidized, break the exchange coupling between the grains.

There are a number of disadvantages to the introduction of impurities as taught by these references. First, the addition of an impurity material (e.g., 10% by volume $SiO_2$ by Shimizu et al. and 12 atomic percent Y by Howard) results in an excessive decrease in Ms. Therefore, the thickness of the magnetic layer must be increased to maintain Mrt. This is undesirable because an increase in layer thickness is generally accompanied by an increase in space loss between the head and the media which results in broad PW50 and poor overwrite. Second, the sputtering process is made more complex and more costly by the requirement that additional materials be sputtered. The additional step of oxidizing a sputtered layer also adds to the complexity and cost of the sputtering process. Third, introduction of oxygen or nitrogen from a gas in the sputtering environment is a difficult process to control precisely, and variations in oxygen or nitrogen concentrations from disk to disk through sputtering is not uncommon. This is particularly true for individual-disk sputtering systems such as those manufactured by Intervac Corp. and others.

Therefore, there is at present a need in the art for a method of reducing media noise without jeopardizing other media performance characteristics such as high coercivity, high degree of squareness, high SNR, high overwrite, and low PW50.

SUMMARY OF THE INVENTION

In accordance with the present invention, a magnetic recording media is manufactured by a sputtering technique in which the sputtering target employed has added thereto an oxide or nitride of at least one of the primary constituents of the magnetic layer of the media. The oxide is thereby deposited in proportion to its concentration in the target together with the magnetic layer constituents and may therefore be precisely controlled and uniformly distributed. No impurities are introduced to support the introduction of oxygen or nitrogen.

The concentration of the oxide in the target, and hence in the magnetic layer, is selected to significantly reduce the media noise resulting from intergranular exchange coupling. The limit on the concentration of the oxide or nitride in the sputter target is that which results in a concentration of the oxide or nitride in the magnetic layer at which coercivity falls below a preset target value and squareness falls to an undesirable level. This is typically at about or below 10 atomic percent (at. %).

The resulting additional material in the magnetic layer has a minimal impact on the magnetic layer's Ms, and hence minimal impact on the overall thickness of the magnetic layer. Furthermore, the method of adding the oxide or nitride is readily controllable and adds little additional complexity or cost to an existing sputtering process.

Importantly, high coercivity and squareness are obtained from the introduction of an oxide or nitride due to the reduction in the interparticle exchange interaction.

Examples of magnetic alloys which may be employed with the present invention include CoNiPt, CoNiCrPt, CoNiPtTi, CoNiPtTa, CoNiPtTiTaB, etc. Therefore, examples of oxides and nitrides which may be included in the sputtering target together with the magnetic alloy include CoO, $Co_2O_3$, $Co_3O_4$, $TiO_2$, $Ta_2O_5$, $CrO_2$, NiO, CoN, TiN, TaN, CrN, NiN, etc.

As an alternative to including the oxide or nitride of a primary constituent of the magnetic layer in the same sputtering target as the magnetic alloy itself, the oxide or nitride may form a separate target and be co-sputtered with the magnetic alloy.

The effects of the introduction of oxides by the method of the present invention are greatly enhanced by employing a nucleation layer under the magnetic layer. The nucleation layer typically contains NiP, and may be doped for example with an oxide. One specific nucleation layer is comprised of $Ni_3P$ together with 1 percent by weight (wt. %) of $Al_2O_3$. Importantly, the grain structure of the nucleation layer and magnetic alloy facilitate the oxide's or nitride's segregation in the interstices between the grains of the magnetic layer, thereby reducing noise caused by exchange interaction between grains. Grain "clustering" is minimized, and uniform grain topology is achieved.

BRIEF DESCRIPTION OF THE DRAWINGS

The present invention will be described in greater detail below, including specific examples thereof, with regard to the figures, in which:

FIG. 1 is a cross section of a rigid thin-film magnetic disk constructed in accordance with the present invention.

FIG. 2 is a schematic illustration of a sputtering apparatus of the type employed by the present invention.

FIG. 3 is an illustration of the effect which the addition of CoO to a CoNiPt target has on the coercivity of a sputtered media.

FIG. 4 is an illustration of the dependence of coercivity on the base pressure of the sputtering environment.

FIG. 5 is an illustration of the effect which the addition of CoO to a CoNiPt target has on the coercivity squareness of a sputtered media.

FIG. 6 shows a pallet used for transporting substrates through a sputtering apparatus.

FIG. 7 illustrates the effect of varying gas flow rates on the coercivity of disks on various rows of a single pallet sputtered in an ambient of argon and 2% $N_2O$.

FIGS. 8a–8c are high resolution Scanning Electron Microscopy (SEM) photographs (micrographs) of CoNiPt+1 at. % CoO media sputtered over a NiP underlayer under base pressure conditions of $2.1 \times 10^{-7}$ Torr, $1.1 \times 10^{-6}$ Torr, and $1.10 \times 10^{-5}$ Torr respectively.

FIGS. 9a–9c are SEM micrographs of CoNiPt+X at. % CoO sputtered over a NiP underlayer at a base pressure of $2.0 \times 10^{-7}$ Torr, where X=0 at. %, X=1 at. %, and X=2.25 at. % respectively.

FIGS. 10a and 10b are charts illustrating the grain size and distribution for CoNiPt media sputtered over a NiP underlayer at a base pressure of about $2.0 \times 10^{-7}$ Torr for CoO concentrations of 0 at. % and 2.25 at. % respectively.

As between each of these figures, like reference numerals shall denote like elements.

DETAILED DESCRIPTION

FIG. 1 is a cross section (not to scale) of a rigid thin-film magnetic disk 10 constructed in accordance with the present invention. Disk 10 consists of an aluminum alloy substrate 12 onto which a plated layer 14, typically of NiP, is formed by electroless plating or other methods well known in the art. Layer 14 typically has a thickness in the range of 5 to 20 μm. The plated layer 14 of NiP provides strong mechanical support on the relatively soft aluminum substrate 12. After layer 14 is plated onto substrate 12, the disk is polished, textured, and cleaned. Although the embodiment described in detail herein employs an aluminum substrate, media based on other substrate materials such as glass, Memcor (a Trademark for a Corning proprietary glass ceramic material), carbon-based materials, silicon, titanium, stainless steel, etc., are equally within the contemplation of the present invention.

A sputtered nucleation layer 16 is then deposited onto layer 14. Sputtering of nucleation layer 16 may be accomplished as described in U.S. Pat. No. 4,786,564, issued to Chen et al., which is incorporated herein by reference, although other methods such as ion plating and evaporation are known and available. An example of the sputtering conditions for layer 16 include a pressure of 5 to 40 mTorr and a power density between 2 and 3 watts/cm². Typically, sputtered nucleation layer 16 is in the range of 10 to 100 nm thick.

In general, nucleation layer 16 includes NiP, and may also include selected dopants, such as oxides $Al_2O_3$, $TiO_2$, $Ta_2O_5$, $HfO_2$, $ZrO_2$, etc. In one embodiment, the sputtered nucleation layer 16 consists of NiP with P at about 15 wt. % together with 1 wt. % $Al_2O_3$ (although $Al_2O_3$ may be incorporated up to 5 wt. %). It is our understanding that the nucleation layer provides the subsequent magnetic layer with the necessary grain structure to facilitate the segregation of the additive elements to thereby destroy the intergranular exchange coupling for reduced noise and improved magnetic performance. However, materials other than NiP and an oxide may also provide this result.

A layer 18 comprising a magnetic alloy and oxide or nitride of a primary constituent of the magnetic alloy is then deposited on nucleation layer 16. As used herein, a "primary constituent" or "elemental primary constituent" is an element or compound which forms a basis for the magnetic layer regardless of whether oxygen, nitrogen, or other additional elements or compounds are being introduced into the layer. For example, the primary constituents of layer 18 include Co and Pt. Any other additional element or compound, such as yttrium, silicon, hafnium, etc., introduced by the prior art methods discussed above, which is added to the magnetic layer other than a primary constituent is therefore referred to herein as an "impurity".

It should be noted that in the following description and associated figures, the oxide CoO is used an example of the oxide or nitride of a primary constituent (cobalt) of the magnetic alloy which is sputtered together with the magnetic alloy itself according to the present invention. However, this use is by way of example only, and one or more of many such oxides or nitrides are within the contemplation of the present invention.

In one embodiment, layer 18 is an alloy of Co and Pt, and further including the primary constituent Ni. In this embodiment, the platinum concentration is less than about 20 at. %, the nickel concentration is less than about 10 at. %, and the cobalt concentration is greater than about 75 at. %. In another embodiment of our invention, the magnetic portion of layer 18 further includes the additional primary constituents tantalum (Ta) and/or titanium (Ti) in a concentration of about 10 at. % or less. Cr may also be introduced as a primary constituent, for example in a concentration up to about 3 at. % (which provides corrosion resistance, but may also result in some degree of reduction of Ms).

Additionally, the impurity boron (B) may be added to the magnetic alloy portion of layer 18, for example to further reduce the media noise. The concentration of B in the magnetic layer may vary up to about 6 at. %. Results of our research show that a smaller amount of B, generally 3 at. % or lower, is sufficient to reduce media noise and thus improve the signal-to-noise ratio of our selected alloy without seriously degrading the Ms of the recording medium.

In general, the sum of the Ta, Ti, Cr, and/or B should not exceed about 20 at. % of the total alloy so as to maintain high Ms. However, the exact amounts of the various constituents may be adjusted, above or below the cited ranges, in order to optimize one or more aspects of the resulting media. Also, although the addition of Ni, Ta, Ti, Cr, and B have been discussed herein, this description should not be read to exclude the addition of other elements, as appropriate.

It is well known that the concentrations of materials deposited on a substrate by sputtering is directly proportional to the concentrations of those elements in the sputtering target. Therefore, according to the present invention, an oxide or a nitride of one or more of the primary constituents of the magnetic layer (by primary constituents, it is meant the constituents that would be deposited in the absence of an oxide or nitride as described herein) is added to the sputtering target in proportion to the amount desirable in the magnetic layer. As an example, up to 10 percent, but preferably about 2 percent CoO is added to the sputtering target, as discussed further below.

Finally, a protective over layer 20 of a type known in the art, e.g., of hydrogenated carbon, or oxides such as $ZrO_2$, $SiO_2$, etc., or nitrides such as TiN, ZrN, etc., and a lubricant layer 22 of a type known in the art, e.g., a solid or liquid lubricant, are applied over layer 18. Details of the protective over layer 20 and lubricant layer 22 are beyond the scope of the present invention, and therefore are not discussed in detail herein.

Specifically, the sputtered layers of thin-film magnetic disk 10 were sputtered in the in-line sputtering apparatus 30 shown in FIG. 2, although other equivalent apparatus are within the scope of the present invention. Apparatus 30 includes a chamber 32 into which a substrate 12 is placed. As described above, substrate 12 is typically an aluminum disk plated on each side with a nickel-phosphorous alloy 14. Substrate 12 is mechanically coupled to a disk pallet carrier which moves substrate 12 past a first, second, and third pair of targets 34a, 34b, 36a, 36b, 38a, and 38b, respectively. Targets 34a and 34b are used to sputter a NiP alloy 16 onto substrate 12 as discussed in Chen et al., U.S. Pat. No. 4,786,564, which is incorporated herein by reference. Targets 36a and 36b, which shall be discussed in further detail below, are thereafter used to sputter an alloy of CoNiCrPt and oxide or nitride 18 onto the sputtered NiP underlayer 16. Targets 38a and 38b are then used to sputter carbon 20 onto layer 18.

Typical sputtering targets have a width W between about 10 and 30 cm. In one embodiment, targets having a width of about 20 cm are used. Targets 36a and 36b are separated from targets 34a and 34b, and 38a and 38b, by a distance D1 of about 1.5 meters. Targets 34a, 36a, and 38a are separated from targets 34b, 36b, and 38b by a distance of about 15 cm or less. Due to the spacing between the various targets, sputtered particles from the various targets do not interfere with the particles sputtered from adjacent targets.

Apparatus 30 also includes gas sources 40, 42, and 44 for introducing an inert gas, such as argon, krypton, etc., into the vicinity of targets 34a and 34b, 36a and 36b, and 38a and 38b respectively. Gas evacuation pumps 46, 48, and 50 are provided to remove gas from the vicinity of targets 34a and 34b, 36a and 36b, and 38a and 38b respectively.

One embodiment of alloy layer 18 was RF diode sputtered $CoNi_{0.09}Pt_{0.10}$ together with 2 at. % CoO (where the subscripts represent the atomic percent, for example 9 at. % Ni, and where the missing subscript denotes the balance of the alloy). The material was sputtered at about 3.0W/cm² from targets 36a and 36b of $CoNi_{0.09}Pt_{0.10}$ plus 2 at. % CoO. The NiP under layer 16 was approximately 38 nm thick, sputtered at 30 mTorr of argon gas. The carbon overcoat 20 was about 30 nm thick. The CoNiPt-plus-CoO layer was approximately 38 nm thick, also sputtered at about 30 mTorr of argon.

FIG. 3 shows the effect of varying the CoO content for varying base pressures. As can be seen for low base pressure conditions, such as $2.8 \times 10^{-7}$ Torr, Hc increased by as much as 700 Oe when the amount of CoO added to the magnetic alloy was increased up to 2.25 at. %. At high base pressures, such as $1.1 \times 10^{-5}$ Torr, the addition of CoO has minimal effect on Hc.

It is common for the base pressure in sputtering apparatus such as that described and shown in FIG. 2 to increase over time during use. According to methods of the prior art, this increase in base pressure results in a substantial undesirable change in Hc between disks sputtered at different times in the sputtering apparatus. This is shown in FIG. 4, which illustrates the dependence of Hc on base pressure for the alloy CoNiPt formed on a Cr underlayer. Typically, this mandates that the sputtering apparatus be shut down and cleaned, interrupting disk production. Productivity of the sputtering machine is reduced, and the cost of the media is increased. However, as can be seen in FIG. 3, at a CoO addition of about 2.25 at. %, Hc remained fairly constant over the range of base pressures between $2.8 \times 10^{-7}$ to $1.1 \times 10^{-5}$. Thus, the addition of CoO provides the benefit of stabilizing Hc over varying base pressure, allowing extending the continuous operation of the sputtering apparatus beyond that achievable by the prior art. Productivity of the sputtering machine is increased, and the cost of media may be reduced.

FIG. 5 illustrates the effect of the addition of CoO on the coercivity squareness S* across a range of coercivities. As can be seen from FIG. 5, S* increased at virtually all coercivity values when CoO was added to the magnetic layer, as compared to a magnetic layer without CoO. In addition, up to at least 2 at. % CoO, the squareness of the magnetic layer increased with increasing CoO concentration. It is believed that this is the trend for concentrations of CoO above 2 at.%.

We have discovered that in an in-line sputtering system such as that described and shown in FIG. 2, the introduction of oxygen containing gases into the sputtering environment leads to the disadvantage of variation in magnetic properties from disk to disk within a batch of disks. Specifically, in-line sputtering apparatus typically employ pallets, such as shown in FIG. 6 and described in detail in U.S. Pat. No. 5,244,555 to Allen et al., to transport the substrates through the sputtering chambers. In our experiment, a pallet was used which had four rows of four disks each, uniformly distributed on the pallet. Substrates having a plated NiP layer were sputtered first with a NiP underlayer, then with $CoNi_{0.07}Cr_{0.04}Pt_{0.12}$. The disks were sputtered at varying flow rates of argon with 2% $N_2O$ (as a source of gaseous oxygen) added to the argon. As FIG. 7 illustrates, the coercivity of the disks sputtered in the presence of argon and $N_2O$ were significantly sensitive to changes in the gas flow rate. In particular, the difference in coercivity of the disks from row to row increased as gas flow rates were increased; rows 2 and 3 showing more of this effect than rows 1 and 4.

The gas in the sputtering chamber was analyzed using a Residual Gas Analyzer (manufactured by Spectra, Inc., Morgan Hill, Calif.). Results of the analysis of the gas showed that the $N_2O$ gas in the vacuum chamber dissociated into $N_2$ and O. This verifies that the $N_2O$ is a source of oxygen in the magnetic layer. It is believed that the high reactivity of the oxygen was the prime contributant to the non-uniformity of the coercivity. This means that if oxygen is introduced in the gas to reduce media noise, raise coercivity and squareness, etc., as taught in the prior art, the disk-to-disk (and within-disk) uniformity of Hc will be poor.

FIGS. 8a–8c are high resolution SEM micrographs illustrating the effect that varying the base pressure has on the grain size and relationship between grains of a magnetic layer of $CoNi_{0.09}Pt_{0.10}$. Each of the micrographs were taken at 300× magnification using an Hitachi S900 scanning electron microscope. Each magnetic layer was sputtered on an approximately 50 nm thick NiP underlayer, and the $CoNi_{0.09}Pt_{0.10}$ layer itself was approximately 50 nm thick. The argon pressure in the sputtering chamber was roughly 30 mTorr. FIG. 8a is a micrograph of a CoNiPt layer sputtered at a base pressure of $2.1\times10^{-7}$ Torr. FIG. 8b is a micrograph of a $CoNi_{0.09}Pt_{0.10}$ layer sputtered at a base pressure of $1.10\times10^{-6}$ Torr. Finally, FIG. 8c is a micrograph of a $CoNi_{0.09}Pt_{0.10}$ layer sputtered at a base pressure of $1.1\times10^{-5}$ Torr. It is understood that the amount of water present in the sputtering system increases as the base pressure increases. Therefore, an increase in base pressure means that the water present during sputtering increases. The result of this, as illustrated FIGS. 8a–8c, is that the grains of the CoNiPt layer become smaller and more isolated from each other. This isolation results in an increase in coercivity due to the localization of the flux reversal between adjacent grains.

FIGS. 9a–9c are also high resolution SEM micrographs illustrating the effect that varying the CoO content has on the grain size and relationship between grains of a magnetic layer of $CoNi_{0.09}Pt_{0.10}$. The $CoNi_{0.09}Pt_{0.10}$-plus-CoO layer of these figures was also approximately 50 nm thick, and was formed on a NiP underlayer approximately 50 nm thick. For these magnetic layers, the argon pressure in the sputtering chamber was roughly 30 mTorr, and the base pressure was roughly constant at $2.1\times10^{-7}$ Torr. For the micrograph of FIG. 9a, no CoO was added to the sputtering target, and hence the magnetic layer included no CoO. For the micrograph of FIG. 9b, the CoO content in the sputtering target, and hence in the magnetic layer, was 1 at. %. Finally, for the micrograph of FIG. 9c, the CoO content in the sputtering target, and hence in the magnetic layer, was raised to 2.25 at. %. As can be seen in these figures, the grain size comprising the various magnetic layers decreased as the CoO content in the magnetic layer increased.

These results may be interpreted to mean that the effects of grain isolation and reduction of grain size experienced by the introduction of increasing amounts of water, and hence oxygen, are also obtained by increasing the CoO content in the sputtering target. The degree that the sputtering of CoO provides these effects is shown in FIGS. 10a and 10b, which are histograms showing the grain sizes measured from the micrographs of FIGS. 9a and 9c, respectively. As can be seen, the presence of 2.25% CoO results in a smaller average grain size and tighter distribution of grain size as compared to no CoO present in a $CoNi_{0.09}Pt_{0.10}$ magnetic layer. The average grain size of the $CoNi_{0.09}Pt_{0.10}$ layer was approximately 18 nm, while the average grain size for the $CoNi_{0.09}Pt_{0.10}$-plus-2.25 at. % CoO was approximately 12 nm. These results strongly suggest that the enhanced coercivity and S* of the Co-Pt alloy with the addition of CoO, as seen in FIGS. 3 and 5, is due at least in part to smaller grain size, and possibly more uniform grains, resulting in a smaller switching field distribution during magnetization reversal.

Based on these results, it is currently believed that the presence of oxygen or oxide in the magnetic layer changes the growth behavior of the magnetic layer. In particular, the growth behavior is interrupted resulting in more isolated and smaller grains which result in enhancement of Hc and S*. Furthermore, it is believed that the presence of nitrogen and or nitrides will provide the same effect, and also result in enhancement of Hc and S*.

While the invention has been described above with respect to the specific embodiments, those skilled in the art will appreciate that modifications may be made without departing from the spirit and scope of the invention. For example, the above description employs the oxide CoO in the sputtering target during deposition of the magnetic layer. However, it is believed that virtually any other oxide or nitride of a primary constituent of the magnetic layer will also produce the desired increase in Hc and S*. Such other oxides include but are not limited to $Co_2O_3$, $Co_3O_4$, etc. Such nitrides include CoN, $Co_2N$, TiN, TaN, CrN, NiN, etc. One consideration in selecting the oxide or nitride, however, is the desire to maintain magnetic layer thickness at a minimum. Therefore, oxides or nitrides having a high oxygen content may be desirable.

Furthermore, the magnetic alloy itself may contain primary constituents in addition to cobalt, nickel, and platinum, such as chromium (Cr), titanium (Ti), and/or tantalum (Ta), aluminum (Al), and tungsten (W). In this case, other oxides within the scope of the present invention include $CrO_2$, $Cr_2O_3$, $TiO_2$, $Ta_2O_5$, $Al_2O_3$, WO, etc.

Finally, although the described introduction of an oxide by way of sputtering has been to add the oxide to the target from which the magnetic layer is sputtered, in certain sputtering systems it may be advantageous to co-sputter the oxide or nitride from a separate target. Therefore these and other variations on the introduction of an oxide or nitride of a primary constituent of the magnetic layer into the sputtering target are within the scope of the present invention.

What is claimed is:

1. An improved method of manufacturing a magnetic disk wherein primary constituents from a sputter target are sputter deposited onto a substrate to form a ferromagnetic layer thereon such that oxygen is incorporated into said ferromagnetic layer, the improvement comprising:

providing a sputtering target to which has been added an oxide of at least one of said primary constituents, such that said oxide is deposited with said primary constituents during sputtering in an amount not greater than 10 atomic percent of said primary constituents, and further such that substantially no other impurity elements or impurity compounds are present in the target;

sputter depositing said primary constituents and said oxide of at least one of said primary constituents in a vacuum at a base pressure of not more than $2.8\times10^{-7}$ Torr; and said method capable of manufacturing a ferromagnetic layer having a coercivity of not less that 1500 Oe and simultaneously a coercivity squareness of not less than 0.75.

2. The improved method of claim 1, wherein said primary constituents include at least one element selected from the group consisting of Co, Ni, Cr, Pt, Ti, Ta, B, Al, and W.

3. The improved method of claim 1, wherein said oxide is CoO.

4. An improved method of manufacturing a magnetic disk wherein primary constituents from a sputter target are sputter deposited onto a substrate to form a ferromagnetic layer thereon such that nitrogen is incorporated into said ferromagnetic layer, the improvement comprising:

providing a sputtering target to which has been added a nitride of at least one of said primary constituents, such that said nitride is deposited with said primary constituents during sputtering in an amount not greater than 10 atomic percent of said primary constituents, and further such that substantially no other impurity elements or impurity compounds are present in the target;

sputter depositing said primary constituents and said nitride of at least one of said primary constituents in a vacuum at a base pressure of not more than $2.8 \times 10^{-7}$ Torr; and said method capable of manufacturing a ferromagnetic layer having a coercivity of not less that 1500 Oe and simultaneously a coercivity squareness of not less than 0.75.

5. The improved method of claim 4, wherein said primary constituents include at least one element selected from the group consisting of Co, Ni, Cr, Pt, Ti, Ta, B, Al, and W.

6. A method of controlling the coercivity of a ferromagnetic layer deposited in an apparatus for sputter deposition of selected primary constituents from a sputter target onto a substrate wherein base pressure of the apparatus varies during sputtering comprising the steps of:

providing in said apparatus a sputter target containing at least one of said primary constituents and to which has been added an oxide of said at least one of said primary constituents in an amount not greater than 10 atomic percent of said primary constituents;

sputter depositing said at least one of said primary constituents together with said oxide at a base pressure of not more than $2.8 \times 10^{-7}$ Torr so as to provide said ferromagnetic layer with oxygen in an amount not greater than 10 atomic percent from said oxide; and said method capable of manufacturing a ferromagnetic layer having a coercivity of not less that 1500 Oe and simultaneously a coercivity squareness of not less than 0.75.

7. The method of claim 6, wherein said primary constituents include at least one element selected from the group consisting of Co, Ni, Cr, Pt, Ti, Ta, B, Al, and W.

8. The method of claim 6, wherein said oxide is CoO.

9. A method of controlling the coercivity of a ferromagnetic layer deposited in an apparatus for sputter deposition of selected primary constituents from a sputter target onto a substrate, wherein base pressure of the apparatus varies during sputtering comprising the steps of:

providing in said apparatus a sputter target containing at least one of said primary constituents and to which has been added a nitride of said at least one of said primary constituents in an amount not greater than 10 atomic percent of said primary constituents;

sputter depositing said at least one of said primary constituents together with said nitride at a base pressure of not more than $2.8 \times 10^{-7}$ Torr so as to provide said ferromagnetic layer with nitrogen in an amount not greater than 10 atomic percent from said nitride; and said method capable of manufacturing a ferromagnetic layer having a coercivity of not less that 1500 Oe and simultaneously a coercivity squareness of not less than 0.75.

10. The method of claim 9, wherein said primary constituents include at least one element selected from the group consisting of Co, Ni, Cr, Pt, Ti, Ta, B, Al, and W.

* * * * *